United States Patent [19]

Iida

[11] Patent Number: 4,603,586

[45] Date of Patent: Aug. 5, 1986

[54] DELAY LINE CIRCUIT ARRANGEMENT AND ULTRASONIC IMAGING APPARATUS UTILIZING THE SAME

[75] Inventor: Taketoshi Iida, Tochigi, Japan

[73] Assignee: Kabushiki Kaisha Toshiba, Kawasaki, Japan

[21] Appl. No.: 690,123

[22] Filed: Jan. 10, 1985

[30] Foreign Application Priority Data

Jan. 18, 1984 [JP] Japan ................... 59-5535

[51] Int. Cl.⁴ ........................................... G01N 29/00
[52] U.S. Cl. ...................................... 73/626; 333/138
[58] Field of Search ............... 73/626, 625, 631, 609, 73/610, 606; 367/105, 122; 128/660; 333/138

[56] References Cited

U.S. PATENT DOCUMENTS

| | | | |
|---|---|---|---|
| 4,005,382 | 1/1977 | Beaver | 73/626 |
| 4,180,791 | 12/1979 | Tiemann | 73/626 |
| 4,291,286 | 9/1981 | Wagner | 333/138 |
| 4,302,735 | 11/1981 | Nibby, Jr. et al. | 333/138 |
| 4,330,875 | 5/1982 | Tachita et al. | 367/105 |
| 4,425,634 | 1/1984 | Iino et al. | 367/105 |

*Primary Examiner*—Stephen A. Kreitman
*Attorney, Agent, or Firm*—Finnegan, Henderson, Farabow, Garrett & Dunner

[57] ABSTRACT

An analogue delay line circuit arrangement is constructed by a plurality of delay line elements and a plurality of compensation amplifiers. These delay line elements and compensation amplifiers are series-connected, one by one, so as to construct a cascade connection. The input echo signals are delayed in the delay line elements and simultaneously the amplitudes thereof abruptly decrease at the high frequency range. The cascade-connected amplifiers can compensate for the abrupt decrease of the signal amplitudes. The delay line elements are constructed of passive elements such as the capacitors and inductors. The compensation amplifiers are constructed of active elements such as the emitter follower transistor.

3 Claims, 12 Drawing Figures

F I G. 5
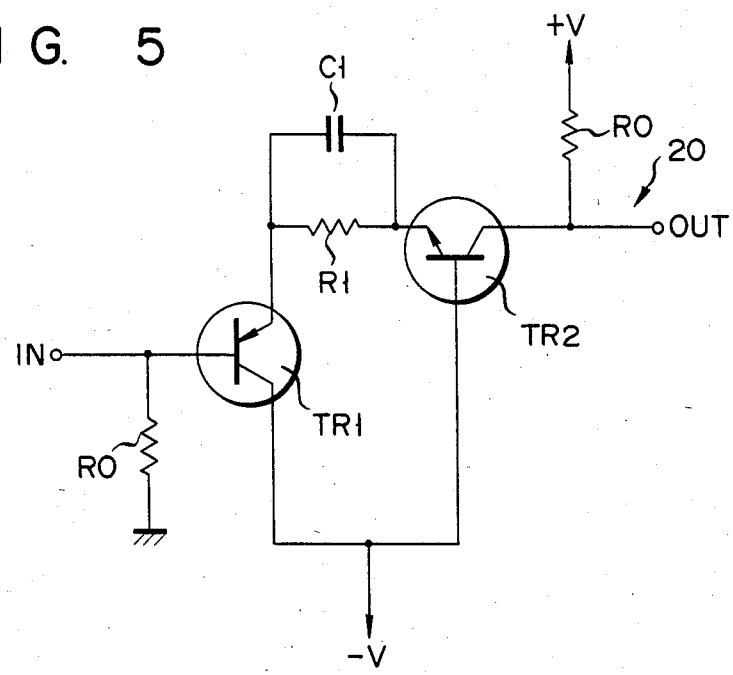
F I G. 6
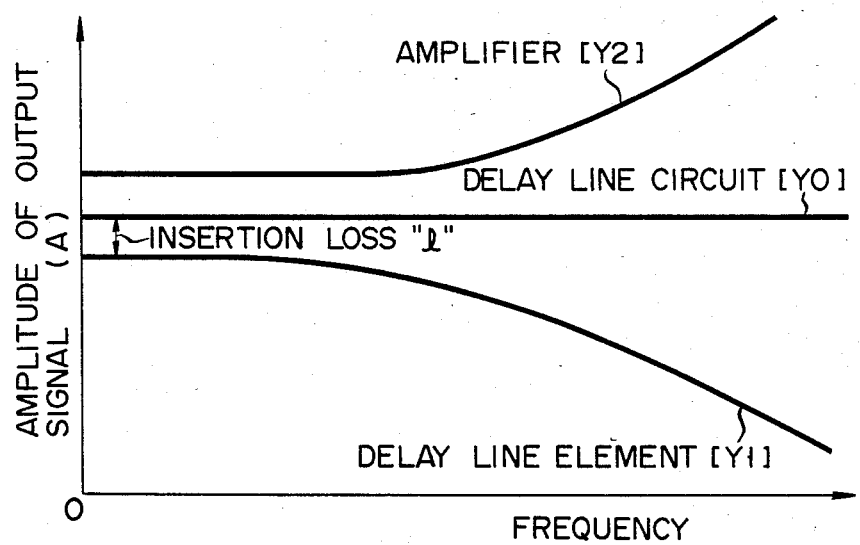

DELAY LINE CIRCUIT ARRANGEMENT AND ULTRASONIC IMAGING APPARATUS UTILIZING THE SAME

BACKGROUND OF THE INVENTION

1. Field of the Invention

The present invention is directed to a delay line circuit arrangement and an ultrasonic imaging apparatus utilizing the same.

2. Description of the Invention

In general, a conventional ultrasonic imaging apparatus employs a circuit arrangement of an analogue delay line DL that is mainly constructed by inductors and capacitors so as to steer and also focus echo signals derived from a transducer during the signal reception. For ultrasonic pulse transmission, a digital delay line is normally utilized, which is technically different from the analogue delay line.

A typical analogue delay line circuit arrangement is shown in FIG. 1. The delay line DL has a plurality of taps for various delay times, e.g., 0.8 $\mu$S. An analogue switch ASW is connected to these selection taps so as to select the desirable delay time. Between an input terminal IN and an output terminal OUT, both the delay line DL and the analogue switch ASW are connected, and matching resistors Rm are also connected.

The circuit arrangement of the delay line DL shown in FIG. 1 is arranged in such a manner that a plurality of delay line elements are connected in a cascade connection, each of which has its own delay time of approximately, e.g., 10 ns (0.01 $\mu$S). Accordingly, the desirable delay time can be easily obtained by assembling the given number of cascade-connected delay line elements.

FIG. 2 shows a circuit diagram of the typical delay line element. The delay line element is constructed by inductors $L_1$, $L_2$ and capacitors $C_1$, $C_2$. These circuit elements practically function as a filter or the like for the received echo signals.

When the analogue delay line circuit having the delay time of 5 $\mu$S is designed, a hundred pieces of the delay line elements having, for example, 0.05 $\mu$s delay time are connected in a cascade arrangement.

Consequently, the total insertion loss and the entire amplitude decrease in the high frequency range are adversely influenced by multiplying those of a single delay line element by 100. It is therefore very difficult to realize such an analogue delay line circuit having a delay time in the order of several microseconds for higher frequencies, e.g., 10 MHZ. For instance, if the maximum delay time is selected to be 5 $\mu$s, the effective maximum frequency is limited to approximately 7 MHZ ($-3$ dB below).

Recently, there has been a tendency to introduce an ultrasonic imaging apparatus for utilizing high frequency transducers. Accordingly, the above-described conventional transducer is not sufficient for these current imaging apparatus.

The major cause for the RF frequency problems of the delay line circuit, i.e., an abrupt decrease in the high frequency range of the delayed echo signals, is as follows. A magnetic core that can be driven in the higher frequency of, say, 10 MHZ is not available. Precisely speaking, since there exists a size-limitation on the analogue delay line circuit, the effective sizes of the inductors $L_1$ and $L_2$ are restricted to given small values. Practically, a toroidal core having a diameter of 10 mm is employed. It is, of course, possible to realize a desired RF frequency characteristic if the toroidal core having a larger diameter than the above core could be utilized.

The other cause for poor performance of the delay line circuit is an insertion loss of the echo signals. As previously described, the longer the desirable delay time is set, the greater the total insertion loss of the echo signals. That is, if the tap Xn of the analogue switch ASW is selected, the insertion loss is maximum (see FIG. 1). For instance, if the delay time is selected to be about 5 $\mu$s, the insertion loss amounts to 1 to 2 dB. Accordingly, the amplitude of the delayed echo signal processed in the delay line circuit attenuates in the higher frequency range (see frequency characteristic curve of FIG. 3) due to both the insertion loss and the high frequency response of the delay line circuit.

As easily seen from the characteristic data of FIG. 3, there exist the insertion loss "l" and the amplitude difference "a" due to the degradation of the frequency characteristic, when the tap for the shortest delay time Xl and that for the longest delay time Xn are selected. In other words, the magnitudes of the amplitudes of the output echo signals differ from each other in accordance with the selected delay time, resulting in the poor image quality of the tomographic image obtained by the ultrasonic imaging apparatus employing such a conventional delay line circuit arrangement that is operated under a higher frequency.

Another drawback of the conventional delay line circuit arrangement is the inherent reflection phenomenon thereof. That is to say, although the echo signals input in the delay line circuit via the selected input tap of the analogue switch ASW flow through the given delay line elements and are derived from the output terminal, a part of the input echo signals flows through the remaining delay line elements that were not selected to the output terminal. As a result, a partial echo signal causes the reflection therein. Then, these reflected echo signals are added to the normally-delayed echo signals having time delays. It should be noted that since degrees of the delay time for both delayed echo signals are different from each other, the reflected echo signals are not superimposed with the normally-delayed echo signals. Accordingly, the artifact appears in the resultant tomographic image.

It is therefore an object of the present invention to provide a delay line circuit arrangement constructed of not only such passive elements as coils and capacitors, but also of such active elements as transistors and integrated circuits, these active elements being interposed between the succeeding delay line elements.

Another object of the invention is to provide an ultrasonic imaging apparatus wherein the specific delay line circuit arrangement is employed so as to compensate for the abrupt decrease in the delayed echo signals and the insertion loss thereof, and further to prevent the echo signal reflections in the inoperative delay line elements.

SUMMARY OF THE INVENTION

These objects of the present invention may be accomplished by providing a delay line circuit arrangement comprising:

a plurality of input terminals for receiving ultrasonic echo signals derived from an ultrasonic transducer;

a plurality of analogue delay lines, connected to said plurality of input terminals, for delaying the ultrasonic echo signals by a desirable delay time;

a plurality of amplifiers, alternately series-connected to the plurality of delay lines so as to constitute a cascade-connected circuit, for compensating for a degradation of amplitudes of the delayed echo signals in a high frequency range and also an insertion loss thereof caused by the delay lines by controlling gains and frequency characteristics of the amplifiers; and, an output terminal, connected to one of the plurality of amplifiers, for delivering the compensated and delayed echo signals.

Further, these objects of the present invention may be also accomplished by providing an ultrasonic imaging apparatus comprising:

a transducer having a plurality of transducer elements arranged in an array for transmitting ultrasonic beams toward an object under examination upon receipt of high frequency exciting pulses, and for receiving ultrasonic echoes reflected from the object, thereby producing echo signals;

a transmitter having at least a generator for generating the high frequency exciting pulses and coupled to the transducer so as to apply the exciting pulses to the transducer elements;

a receiver coupled to the transducer and including at least a delay line unit for delaying the received echo signals and also compensating for the degradating of the amplitudes of the delayed echo signals in a high frequency range and also an insertion loss thereof, and a processor for processing the delayed and compensated echo signals so as to produce tomographic image signals; and a monitor for displaying tomographic images of the object scanned by the high frequency ultrasonic beams based upon the tomographic image signals.

BRIEF DESCRIPTION OF THE DRAWINGS

For a better understanding of these and other objects of the present invention, reference is made to the following detailed description of the invention to be read in conjunction with the following drawings, in which;

FIG. 5 is a circuit diagram of a basic circuit of an amplifier employed in the delay line circuit arrangement shown in FIG. 4;

FIG. 6 illustratively shows amplitude/frequency characteristic curves for explaining operations of the amplifier shown in FIG. 5;

DETAILED DESCRIPTION OF THE PREFERRED EMBODIMENT

Figure 1:
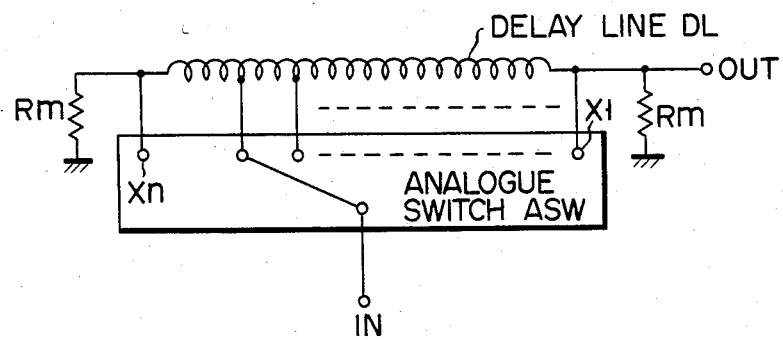
FIG. 1 shows a circuit arrangement of the conventional analogue delay line.
Figure 2:
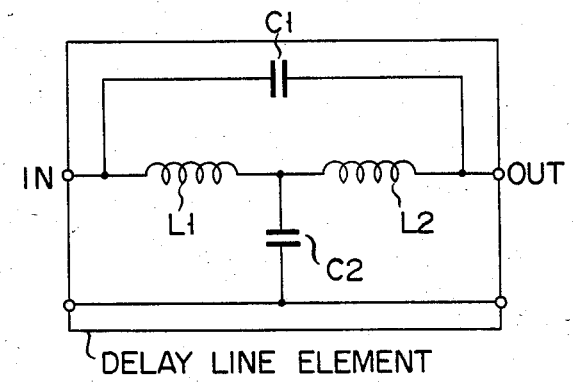
FIG. 2 is a circuit diagram of the delay line element of the delay line shown in FIG. 1.
Figure 3:
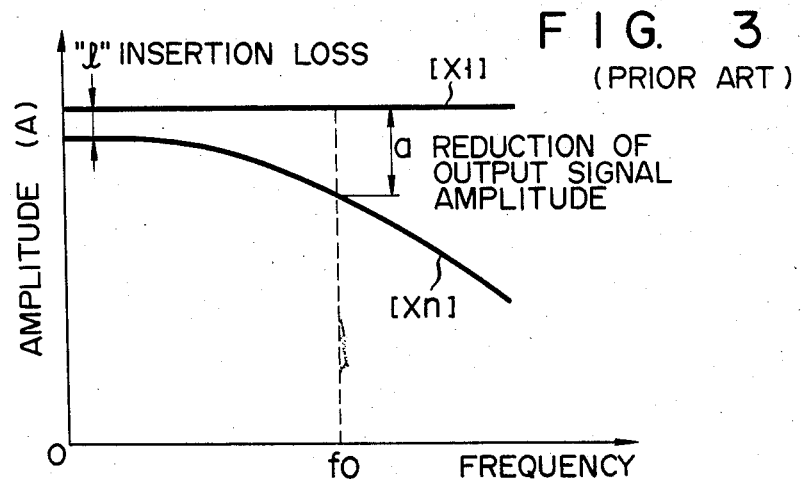
FIG. 3 is a graphic representation for indicating the frequency characteristic and the amplitude of the output signal.
Figure 4:
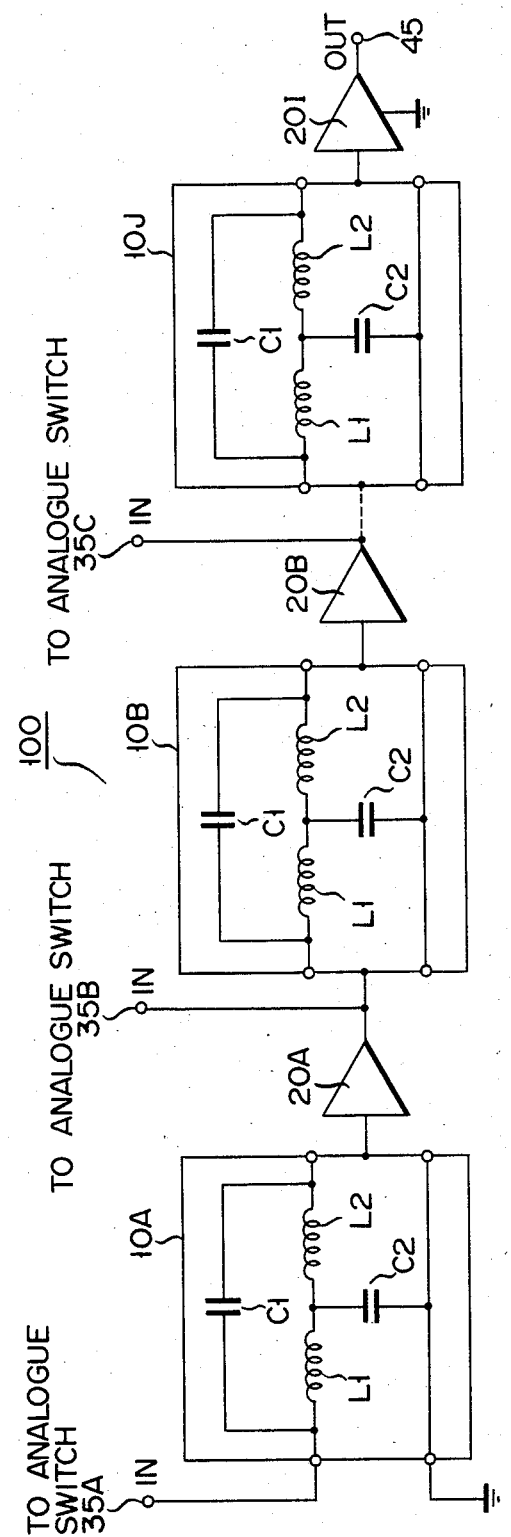
FIG. 4 schematically shows a circuit diagram of an analogue delay line circuit arrangement according to one preferred embodiment.

Reference first is made to FIG. 4 in which there is shown a block diagram of an analogue delay line circuit arrangement 100 according to one preferred embodiment (the analogue switch has been omitted). As easily understood from the circuit, a plurality of delay line elements 10 are cascade-connected, one by one, in series to a plurality of amplifiers 20. The numbers of these delay line elements 10 are determined by calculating the desired delay time, e.g., 8 $\mu$s. It is, for instance, assumed that the delay time Td of the single delay line element 10 is approximately 0.8 $\mu$s and the maximum delay time Tdm of the delay line circuit arrangement 100 is selected to be about 8 $\mu$s. Accordingly, ten elements of the delay line element 10A to 10J and nine circuits of the amplifiers 20A to 20I ae alternately connected one by one to constitute a cascade-connected circuit arrangement.

A basic circuit of the amplifier 20 is shown in FIG. 5. The amplifier 20 is mainly constructed of an emitter follower transistor TR1 and a base-grounded transistor TR2. A matching resistor Ro is connected between the base electrode of the emitter follower transistor TR1 and the ground. The base electrode of this transistor TR1 functions as an input terminal of the amplifier 20. A coupling circuit of a capacitor C1 and a resistor R1 is connected between the emitter of the emitter follower transistor TR1 and the emitter of the base-grounded transistor TR2. The collector of the latter transistor TR2 is connected via another matching resistor Ro to the positive power supply +V. This collector functions as an output terminal of the amplifier 20. Both the collectors of these transistors TR1 and TR2 are commonly connected to the negative power supply −V.

A voltage gain of this amplifier 20 can be determined by the ratio of the matching resistor Ro to the coupling resistor R1 (i.e., Ro/R1).

An amplitude/frequency characteristic of this amplifier 20 can be controlled by the coupling capacitor C1.

A typical operation of the delay line circuit arrangement 100 will now be described with reference to FIGS. 4, 5, and 6.

Now assuming that the amplitude/frequency characteristic of each delay line element 10 represents decay in the high frequency range as indicated by symbol "Y1". Accordingly, the output delayed echo signal of each amplifier 20 is emphasized in the high frequency range as denoted by symbol "Y2".

Then, the gain of the amplifier 10 is set to compensate for the insertion loss "l" of the delay line circuit arrangement 100.

When the received echo signals are supplied to the input terminal 35 of the delay line circuit arrangement 100, they are delayed by the predetermined delay time, i.e., 0.8 $\mu$s in the first delay line element 10A. During this delay operation, the amplitudes of the delayed echo signals are subjected to be decreased in the higher frequency band, compared with that of the input echo signals. In addition to the decrease of the amplitudes, the insertion loss "l" of this delay line element 10A is provided due to the passive circuit elements.

Thereafter, the delayed echo signals are amplified and also frequency-corrected in the first amplifier 20A. The same delay and correction (compensation) operations are successively repeated in the succeeding delay line elements (10B . . . 10J) and amplifiers (20B . . . 20I).

Figure 7:
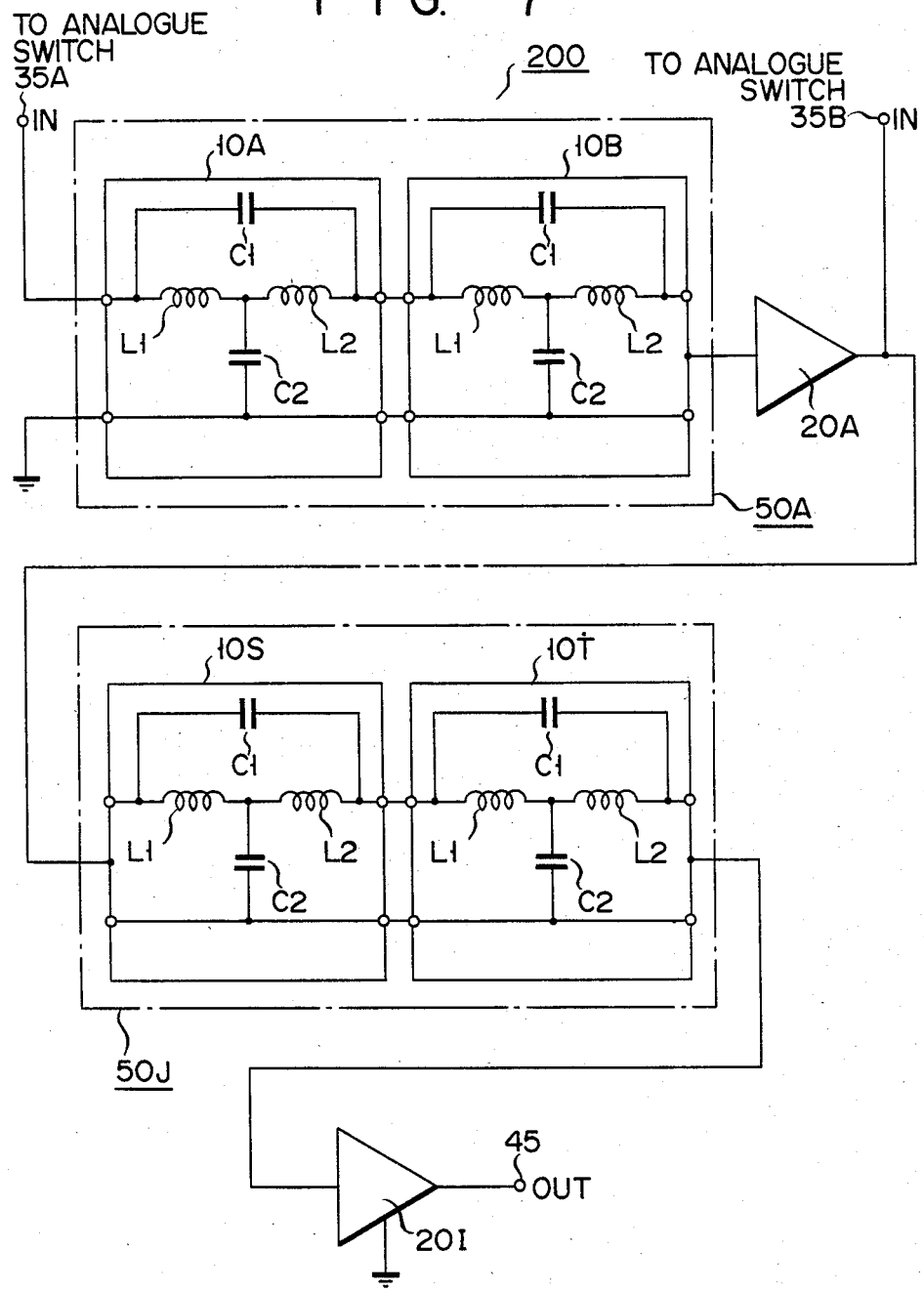
FIG. 7 is a circuit diagram of an analogue delay line circuit arrangement according to a second preferred embodiment.

As a result, the resultant amplitude/frequency characteristic over the entire frequency range, e.g., 0 to 10 MHz, represents a substantially flat line "Yo", as shown in FIG. 7.

In FIG. 7, another circuit arrangement of an analogue delay line 200 according to the second embodiment is shown.

It should be noted that the same reference numerals shown in FIG. 4 will be employed as those for denoting the same circuit elements shown in the following figures.

In this circuit 200, two delay line elements 10A and 10B are combined into a single first delay line section 50A, and ten delay line sections 50A to 50J are cascade-connected in combination with nine amplifiers 20A to 20I. In other words, twenty delay line elements 10A through 10T and nine amplifiers 20A to 20I are cascade-connected to constitute the analogue delay line circuit arrangement 200.

In this circuit 200, each of these amplifiers 20A to 20I can compensate for the degradation of the amplitude/frequency characteristic in the high frequency range and also the insertion loss that have been caused by each of those delay line sections 50A to 50J.

It is, of course, possible to employ more than two delay line elements as the respective delay line sections 50A to 50I, so as to obtain the desirable maximum delay time Tdm.

Figure 8:
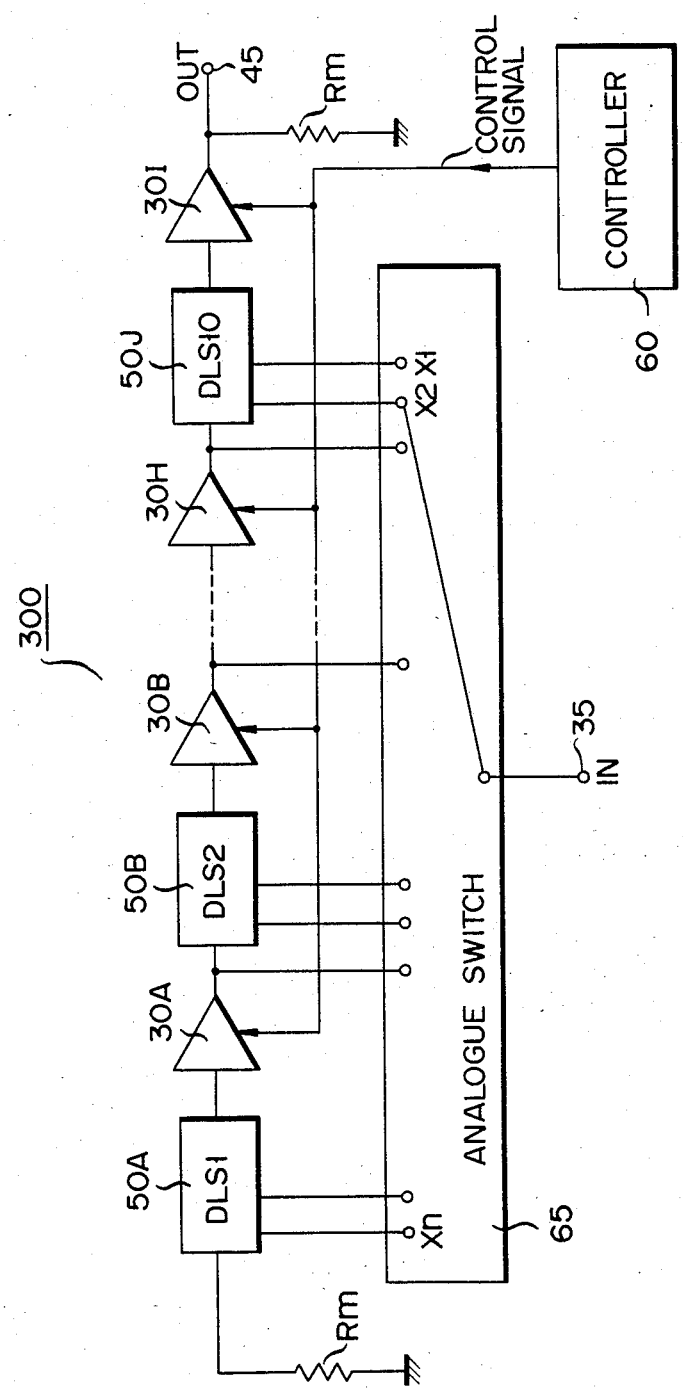
FIG. 8 is a block diagram of an analogue delay line circuit arrangement according to a third preferred embodiment.

FIG. 8 shows a block diagram of an analogue delay line circuit 300 according to the third embodiment. This circuit arrangement 300 is similar to the above-described circuit arrangement 200. That is to say, the same delay line sections 50A to 50J are cascade-connected in combination with newly-employed controllable amplifiers 30A to 30I. A controller 60 is provided to supply various control signals to the respective controllable amplifiers 30A to 30I, thereby the gains and the frequency characteristic of the respective amplifiers 30A to 30I being separatedly controlled by these control signals in accordance with the desirable compensation for the insertion loss and also the high frequency characteristic.

Figure 9:
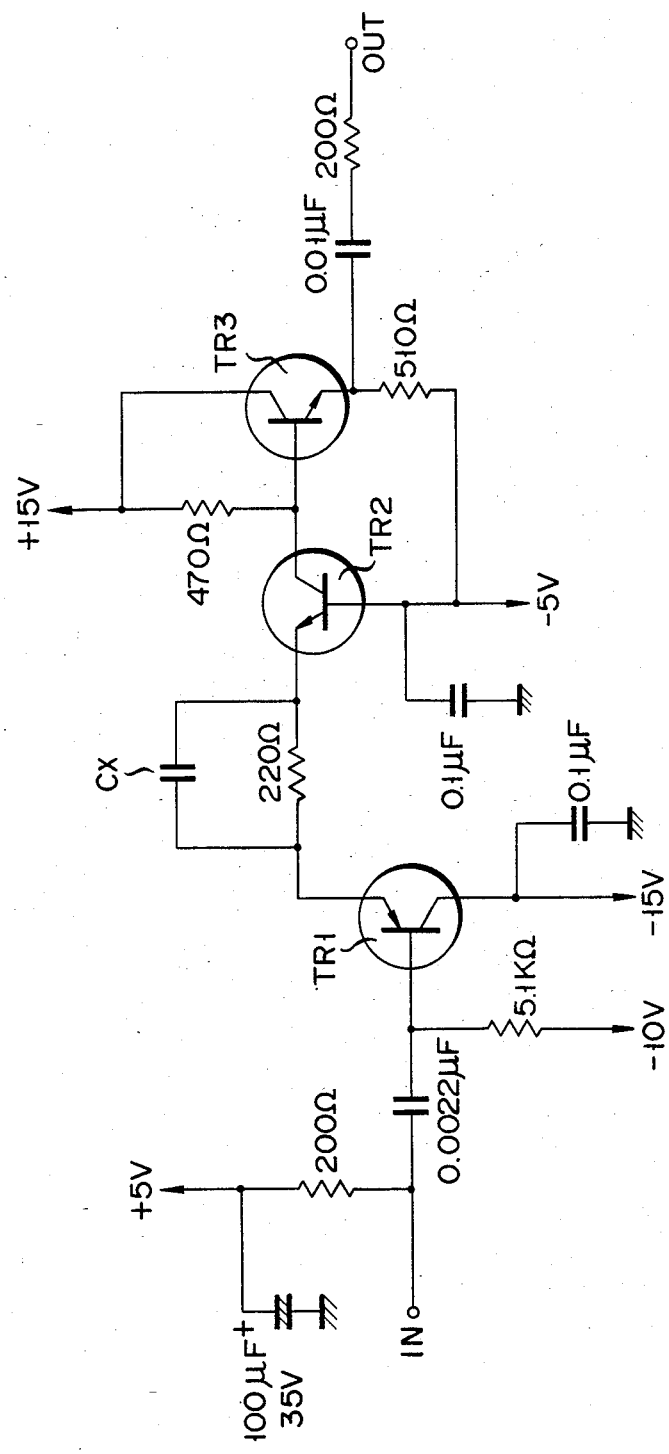
FIG. 9 shows a circuit diagram of a practical circuit of the amplifier according to the invention.

FIG. 9 is a circuit diagram of the amplifier that has been practically designed by the inventor. The first transistor TR1 is of the type of 2SA495 (G) TM-Y (TOSHIBA). The second and third transistor TR2 and TR3 are of the type of 2SC372(G)TM-Y (TOSHIBA). All resistors are in ohms ($\Omega$), and all capacitors are in micro Farad ($\mu$F).

Figure 10:
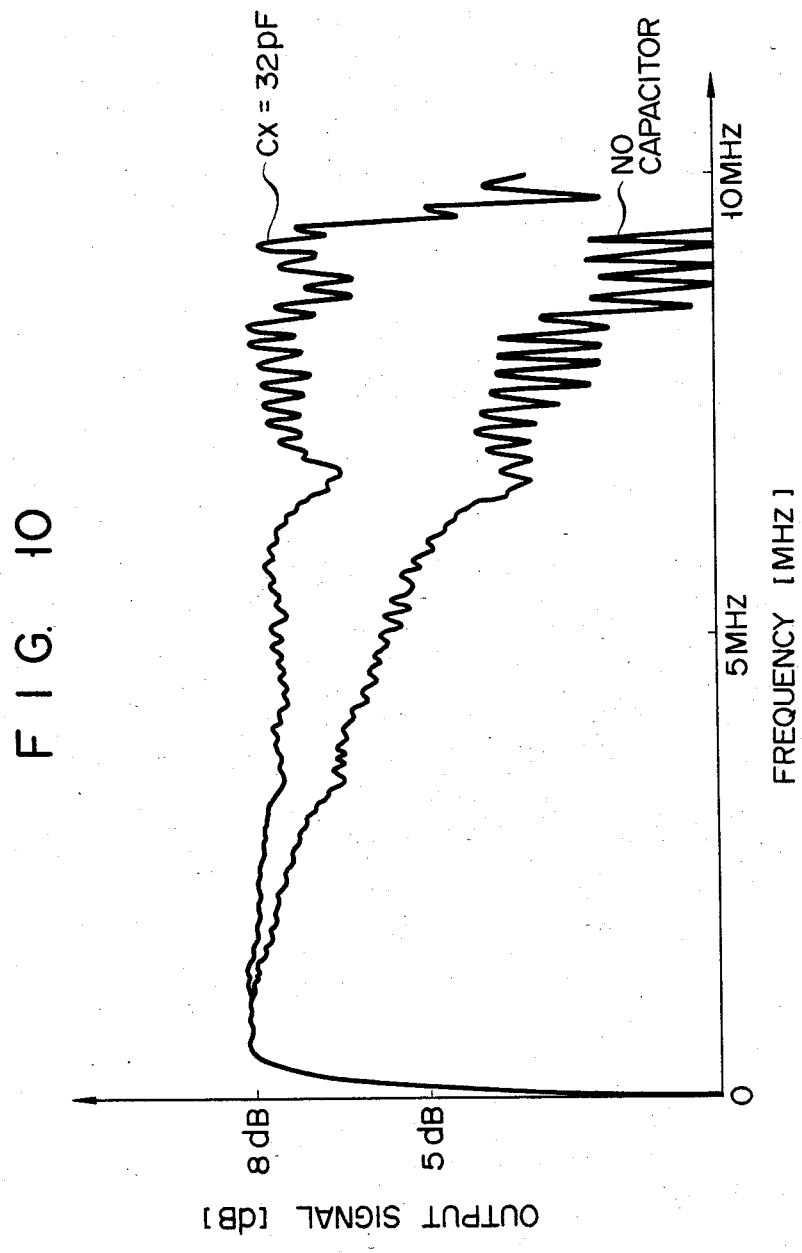
FIG. 10 is a graphic representation for showing output signal/frequency characteristic curves of the amplifier shown in FIG. 9.

When the coupling capacitor Cx is selected to be 32 PF (pico Farad), the amplitude/frequency characteristic of this amplifier is plotted in a graphic representation shown in FIG. 10. From these characteristic curves, it can be understood that the high frequency compensation is effected by introducing this coupling capacitor Cx(32 pF).

According to recent technology, such an amplifier is commercially available as a single chip integrated circuit. Therefore, such small IC chips can be assembled within the housing of the delay line circuit arrangement without requiring the additional space for these amplifier chips.

It is generally known that as the cut off frequency $f_T$ of a commercially available transistor is about 100 MHZ in a standard performance, the maximum high frequency of the ultrasonic transducer can be extended to approximately 20 MHZ with a flat curve over the entire frequency range.

Figure 11:
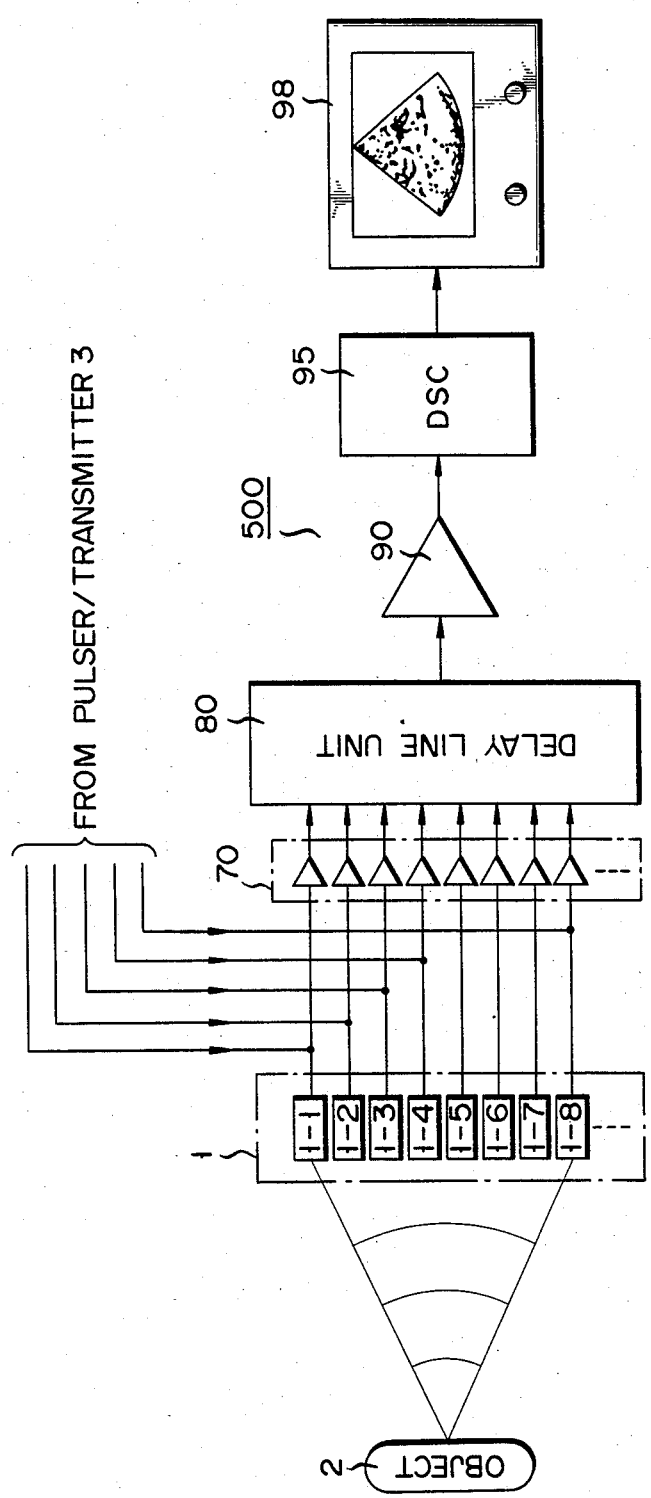
FIG. 11 is a schematic diagram of an ultrasonic imaging apparatus according to the invention.

In FIG. 11, an ultrasonic imaging apparatus 500 is shown in which a delay line unit 80 is employed according to the invention. Exciting pulses derived from the pulser/transmitter 3 (not shown in detail) are successively applied to transducer elements 1-1, 1-2, . . . , 1-8 of a transducer 1 so as to produce echo pulses in a predetermined sequence. These echo pulses are transmitted toward an object 2. Thereafter, the echo pulses penetrate into interiors and boundaries of the object 2, where they are reflected as echo pulses. The reflected echo pulses are received by the same transducer 1 to produce echo signals having the medical information as the amplitude variations and the time elapse data.

The received echo signals are amplified in a preamplifier unit 70. The amplified echo signals are processed by a delay line unit 80 with desirable signal processing so as to derive a tomographic image signal. Then, the tomographic image signal is amplified in an amplifier 90 and converted by a digital scan converter 95 into desirable video signals. Finally, tomographic images of the scanned object 2 can be monitored on a TV monitor 98 with the the video signals having better image qualities, e.g., higher resolution and no artifact.

Figure 12:
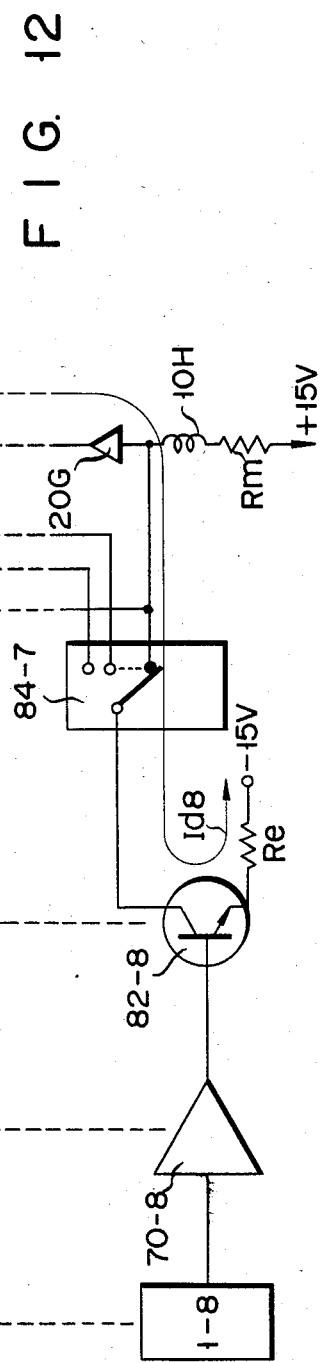
FIG. 12 is a schematic diagram of a delay line unit employed in the apparatus shown in FIG. 11.

FIG. 12 shows a detailed circuit of the delay line unit 80 in which the delay line circuit arrangement according to the invention is operable in conjunction with voltage-to-current converting means. For the sake of simplicity, only the basic circuit is shown.

The first transducer element 1-1 is connected via the first preamplifier 70-1 to the base electrode of the first transistor 82-1. The emitter of the transistor 82-1 is connected through the emitter resistor Re to the negative power supply ($-15$ V). The collector of the transistor 82-1 is connected via the first tap of the first analogue switch 84-1 to the first junction between the matching resistor Rm and the first delay line element 10A, from which the delayed and compensated echo signal is derived.

It should be noted that the delay line elements 10A, 10B to 10G are symbolized as a coil in FIG. 12.

The second transistor element 1-2 is similarly connected via the second preamplifier 70-2 to the base electrode of the second transistor 82-2 whose emitter is connected through the emitter resistor Re to the negative power supply ($-15$ V). The collector of the transistor 82-2 is connected via the second tap of the second analogue switch 84-2 to the second junction between the first amplifier 20A and the second delay line element 10B. The collector of the transistor 82-8 is connected via the last tap of the analogue switch 84-7 to the junction of the last amplifier 20G on the delay line element 20H.

The remaining circuit elements are connected in the same manner as the above-connection.

Both the matching resistors Rm are biased by the positive power supply ($+5$ V).

A description will now be made of operations of the delay line unit 80 shown in FIG. 12.

As previously described, the reflected echo pulses are received and converted by the transducer 1 into the corresponding echo signals. Voltge of the echo signal derived from the first transducer element 1-1 of the transducer 1 is amplified in the first preamplifier 70-1, and then applied to the base electrode of the first transistor 82-1. Since the first tap of the first analogue switch 84-1 has been selected, the following current path is established, i.e., the positive power supply (+5 V) to the matching resistor Rm; the first tap of the first analogue switch 84-1; the collector-to-emitter current path of the first transistor 82-1; the emitter resistor Re and the negative power supply (−15 V).

Accordingly, a first delay current Id1 flows through the above-described current path, whose magnitude corresponds to the amplitude of the voltage of the echo signal derived from the preamplifier 70-1. In fact, as this current Id1 flows through none of the delay line elements 10A to 10H, it is not delayed.

On the other hand, voltage of the echo signal across the second transducer element 1-2 is applied to the base electrode of the second transistor 82-2 after being amplified in the second preamplifier 70-2. Upon reception of the base voltage, the second transistor 82-2 conducts so that a second delay current Id2 flows through the second current path as shown in FIG. 12.

Similarly, the voltage of the echo signal appearing at the eighth transducer element 1-8 is applied to the base electrode of the eighth transistor 82-8, with the result that an eighth delay current Id8 flows through the eighth current path as indicated in FIG. 12.

As a result, the above-described eight delay currents Id1, Id2 . . . Id8 are combined at the matching resistor Rm, so the summed voltage across the resistor Rm is derived. That is to say, this voltage can be obtained by summing the respective delay currents Id1, Id2 . . . Id8. Such a current summation is so-termed "a current summing method".

As previously described in detail, according to the invention, the amplifiers can equivalently compensate for the abrupt decrease in the amplitudes of the delayed echo signals in the high frequency range and also for the insertion loss of the delayed echo signals. Therefore, there is no problem in the image quality of the resultant tomographic images even in the high operation frequency.

Furthermore, the advantage of the present invention is that the entire circuit arrangement can be manufactured to have very small size by employing an IC chip for the amplifier.

In addition to the previous advantages, the undesirable reflections occuring in the succeeding delay line elements can be eliminated by cascade-connecting the corresponding delay line elements and compensation amplifiers. Accordingly, no artifact appears in the resultant tomographic image.

While the invention has been described in terms of certain preferred embodiments, and exemplified with respect thereto, those skilled in the art will readily appreciate that various modifications, changes, omissions, and substitutions may be made without departing from the spirit of the invention.

For example, the analogue delay line circuit according to the invention can be easily utilized in both the linear scan and the sector scan without requiring any complicated adjustment or tempering, although the maximum delay times of both scanning nodes are considerable different from each other, e.g., 1 μs for the linear scan and 5 μs for the sector scan. If the analogue delay line circuit 300 shown in FIG. 8 is operated in the linear scanning mode, and the gains of the amplifiers that are not necessary for the desirable compensation are sufficiently reduced, the so-called crosstalk noise produced from these amplifiers can be avoided.

As apparent from FIG. 4, it is also possible to cascadeconnect one analogue delay line element and one amplifier to establish a single delay line circuit arrangement.

The transistors of the amplifier, as the active element, may be substituted by unipolar transistors such as FET's. To vary the gains of the amplifiers, an impedance change of FET under the control of the gate voltage may be utilized instead of the variable resistor.

What is claimed is:

1. An ultrasonic imaging apparatus having an improved analogue delay line means, said apparatus comprising:

a plurality of ultrasonic transducer elements for converting ultrasonic echoes received thereby into voltage signals;

a plurality of voltage-current converting means respectively connected to said ultrasonic transducer elements, for converting said voltage signals into current signals proportional thereto;

a plurality of switching means, each having a plurality of imput terminals and a single output terminal, for selecting one of said input terminals to be connected with said output terminal, said output terminal being connected to said voltage-current converting means;

analogue delay line means including a plurality of delay lines for delaying said current signals passing therethrough;

a plurality of amplifier means each connected between adjacent delay lines, for compensating for degradation of the amplitudes of said current signals passing through said delay lines;

a plurality of taps derived from said amplifier means to be commonly connected to said input terminals of each of said switching means; and register means, having one constantly biased end and another end connected to one end of said analogue delay line means and an output, for adding said current signals delayed by said delay lines and producing the resultant signal from said output.

2. An apparatus as claimed in claim 1, wherein said amplifier means includes an emitter follower transistor whose base receives said delayed echo signals, a transistor whose base is grounded, and a coupling circuit having a parallel-connected circuit of a resistor and a capacitor and interposed between the emitter of the first-mentioned transistor and the emitter of the last-mentioned transistor.

3. An apparatus as claimed in claim 2, wherein said coupling resistor is approximately 220 ohms and said coupling capacitor is approximately 32 pico Farad.

* * * * *